United States Patent [19]

Seo et al.

[11] 4,114,054

[45] Sep. 12, 1978

[54] COUPLING CIRCUIT USING A PHOTOCOUPLER

[75] Inventors: Mamoru Seo; Akio Uenishi, both of Itami, Japan

[73] Assignee: Mitsubishi Denki Kabushiki Kaisha, Tokyo, Japan

[21] Appl. No.: 764,177

[22] Filed: Jan. 31, 1977

[30] Foreign Application Priority Data

Jan. 30, 1976 [JP] Japan .................................. 51-9011

[51] Int. Cl.² ............................................ H03K 17/00
[52] U.S. Cl. .................. 307/311; 250/211 J; 361/56; 361/91
[58] Field of Search ............ 307/311, 252 UA, 202 A, 307/237; 350/211 J, 578; 361/56, 91

[56] References Cited

U.S. PATENT DOCUMENTS

| | | | |
|---|---|---|---|
| 3,436,548 | 4/1969 | Baird et al. | 250/211 J |
| 3,535,532 | 10/1970 | Merryman | 250/211 J |
| 3,708,672 | 1/1973 | Marinkovic | 307/252 UA |
| 3,801,837 | 4/1974 | Pease et al. | 307/311 |
| 3,812,382 | 5/1974 | Pascente | 307/252 UA |
| 3,816,763 | 6/1974 | Korn et al. | 307/252 UA |
| 3,911,297 | 10/1975 | Mervin et al. | 307/311 |
| 3,940,634 | 2/1976 | Grogan | 307/311 |
| 3,958,175 | 5/1976 | Braun | 307/311 |

*Primary Examiner*—Stanley D. Miller, Jr.
*Assistant Examiner*—B. P. Davis
*Attorney, Agent, or Firm*—Oblon, Fisher, Spivak, McClelland & Maier

[57] ABSTRACT

A solid state relay is arranged in high density to connect a first circuit comprising an outer signal source to a second circuit for driving a load by a photocoupler. A diode or a capacitor is connected in parallel to the light-receiving element of the photocoupler to maintain the voltage between the terminals of the light-receiving element to less than the reverse breakdown voltage of the light-receiving element when a surge voltage having rapid rise time is applied between the input side and the output side of the photocoupler.

A transistor which causes the reverse breakdown prior to the reverse breakdown of the light-receiving element can be connected in parallel to the light-receiving element.

9 Claims, 4 Drawing Figures

COUPLING CIRCUIT USING A PHOTOCOUPLER

BACKGROUND OF THE INVENTION

1. Field of the Invention

The present invention relates to an improvement of a coupling circuit using a photocoupler. More particularly, it relates to a coupling circuit having means for preventing erroneous operation caused by a surge voltage etc.

2. Description of the Prior Art

A solid state relay arranged in high density to electrically separate an outer signal source from a circuit for a driving control of a load by coupling with a photocoupler has been well-known in such as U.S. Pat. No. 3,723,769.

Thus, in the solid state relay arranged in high density, the parts of the circuit in the input side are near the parts of the circuit in the output side whereby a stray capacitance is high not to be negligible. When high surge voltage is applied between the input side and the output side, the reverse breakdown of the light-receiving element for the photocoupler is caused to pass a leak current from the circuit in the output side through the stray capacitance to the circuit in the input side. Even though the surge voltage is raised, the light-receiving element is in the ON state whereby the transistor or the other element of the circuit in the output side disadvantageously causes the erroneous operation.

SUMMARY OF THE INVENTION

It is an object of the present invention to provide a coupling circuit wherein a light-receiving element does not cause the reverse breakdown even though high surge voltage is applied between the input-output.

Another object of the invention is to prevent the erroneous operation of a coupling circuit wherein means for blocking the reverse breakdown of the light-receiving element of the photocoupler is connected in parallel to the light-receiving element.

The coupling circuit of the present invention is formed with a photocoupler comprising a light emission element whose light emission is controlled by a first circuit and a light-receiving element for driving a second circuit by receiving the light from the light emission element to be turned on, and means for maintaining a voltage between the terminals of the light-receiving element to lower than the reverse breakdown voltage of the light-receiving element.

The coupling circuit of the present invention is also formed with the photocoupler comprising the light emission element whose light emission is controlled by the first circuit and the light-receiving element for driving the second circuit by receiving the light from the light emission element to be turned on, and the switching element connected in parallel to the light-receiving element of the photocoupler to cause the reverse breakdown prior to the reverse breakdown of the light-receiving element.

BRIEF DESCRIPTION OF THE DRAWINGS

In the drawings, like references designate identical or corresponding parts.

DETAILED DESCRIPTION OF THE INVENTION

Figure 1:
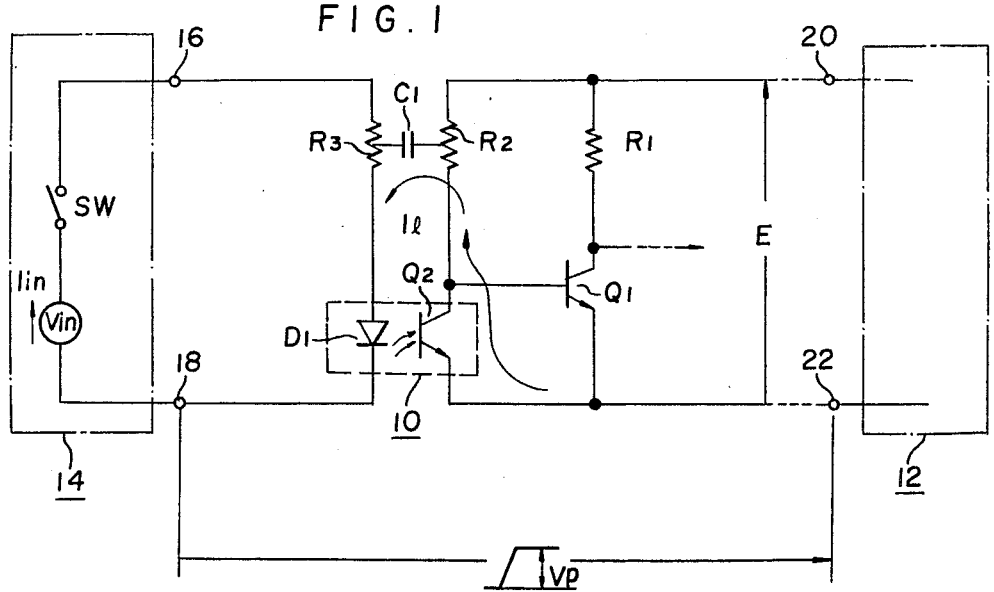
FIG. 1 is a connection diagram of the conventional coupling circuit.
Figure 4:
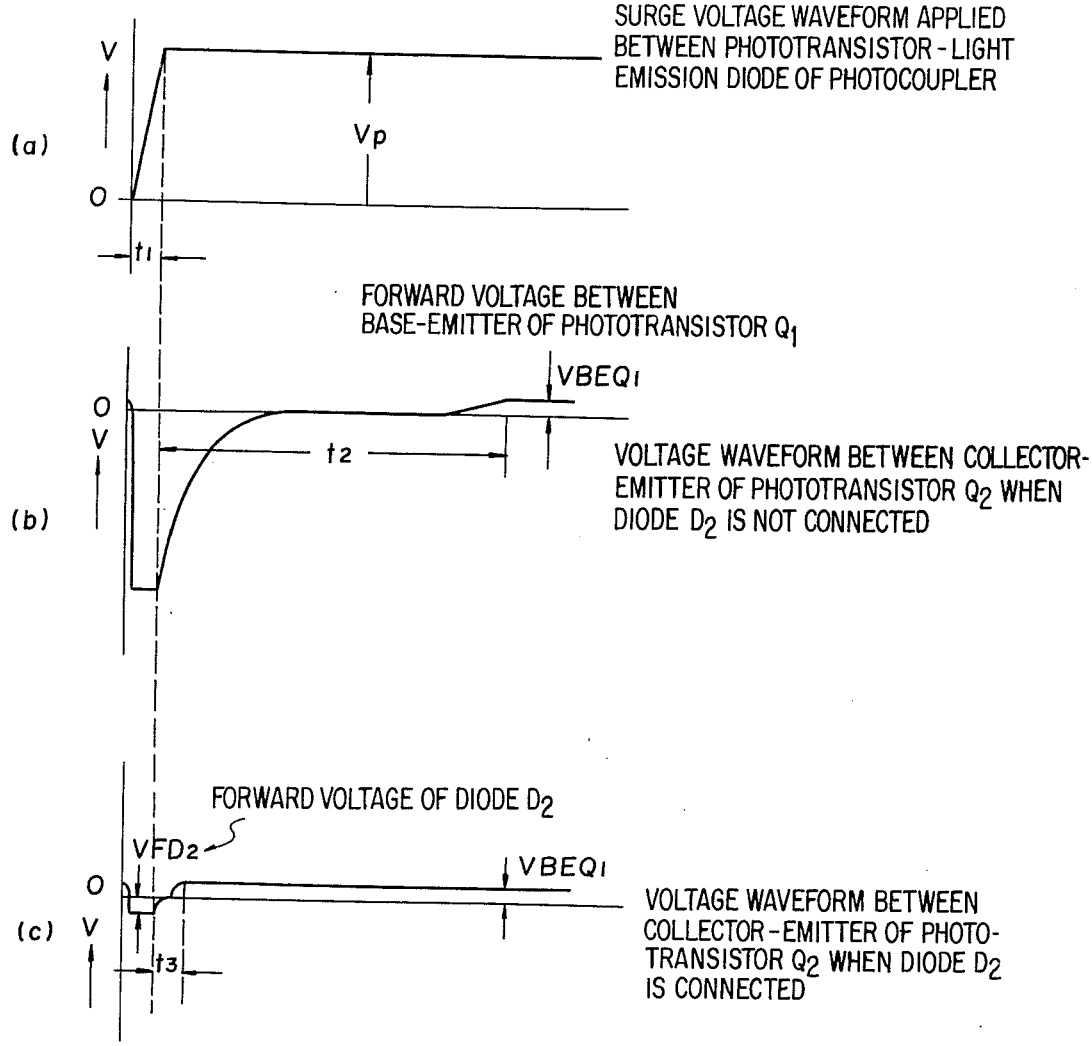
FIG. 4 shows the operation of the embodiments of the coupling circuits of FIGS. 1 and 2.

Referring to FIG. 1 and FIG. 4, the conventional coupling circuit will be illustrated for the easily understandings of the present invention.

The conventional solid state relay has the structure for transmitting the input signal generated from an input signal source $V_{in}$ to a driving circuit 12 by turning on and off a phototransistor $Q_2$ and a transistor $Q_1$ which form a photocoupler 10 as shown in FIG. 1.

The phototransistor $Q_2$ in the OFF state is turned on by receiving the light from a light emission diode $D_1$, only when a switch $S_w$ of a driving control circuit 14 is turned on to feed the input signal current $I_{in}$ through a resistor $R_3$ to the light emission diode $D_1$. At this time, the base current is fed through a reistor $R_2$ whereby the transistor $Q_1$ in the ON state is turned off by forming the short-circuit with the phototransistor $Q_2$ between the base-emitter by turning on the phototransistor $Q_2$. Thus, the collector voltage of the transistor $Q_1$ is raised to apply the output voltage to the driving circuit 12 whereby the driving circuit 12 is operated to drive the load (not shown).

This is the normal operation of the conventional circuit of FIG. 1. However, in the conventional circuit, even though the switch $S_w$ is in the OFF state wherein the input signal is not transmitted to the next photocoupler 10, when the surge voltage $V_p$ which has rapid rising time is applied between the terminals 22, 18 in the polarities of positive at the terminal 22 and negative at the terminal 18 as shown in FIG. 1, the erroneous operation of the phototransistor $Q_2$ is caused to be in the ON state for certain time disadvantageously.

The condition and reason of the erroneous operation of the phototransistor $Q_2$ will be illustrated.

In the circuit prepared for complete electrical separation of the input side from the output side as shown in FIG. 1, it is necessary to minimize the stray capacitance between the input-output circuits, though the stray capacitance is difficultly prevented. The stray capacitance comprises the capacitance between the input-output of the photocoupler 10 and the stray capacitance in the parts of the circuit in the input side (resistor, diode and wiring) and the parts of the circuit in the output side.

Thus, in general, the capacitance between the input-output of the photocoupler 10 which is commercially available is remarkably small as about 0.2 PF, which is negligible. Accordingly, the stray capacitance is mostly the stray capacitance of the parts of the circuits for the input and output.

Recently, it has found the tendency to arrange parts in high density for miniaturization for all of the circuits. In these circuits, the parts of the circuit in the input side are near those of the output side whereby the stray capacitance increases to be difficultly omitted and to be about 2 PF which is not negligible. In FIG. 1, the stray capacitance is designated as $C_1$.

When the circuit of FIG. 1 is used in the interface between the 200 Volt power source and the IC driving circuit, it is estimated to be more than 1000 V/μs of the voltage rising coefficient in the rise time of the surge voltage $V_p$ between the input-output.

Referring to FIG. 1 and FIG. 4, the phenomenon caused by applying the surge voltage $V_p$ to the stray capacitance between the input-output, will be illustrated.

When the surge voltage $V_p$ (FIG. 4a) which has the rapid rise time is applied between the terminals 22, 18 of the circuit of FIG. 1, the closed circuit is formed with the stray capacitance $C_1$ whereby the surge voltage $V_p$ applied to the terminals 22, 18 is applied under division, through the stray capacitance $C_1$ between the collector and emitter of the phototransistor $Q_2$. Accordingly, the reverse breakdown of the junction between the base-emitter of the phototransistor $Q_2$ is resulted to pass the leak current $I_l$ through the path of FIG. 1.

When the reverse breakdown of the junction of the base-emitter of the phototransistor $Q_2$ is resulted, the carriers are accumulated in the base of the phototransistor $Q_2$ whereby the surge voltage $V_p$ applied between the terminals 22, 18 is raised to prevent the passage of the leak current $I_l$. When the voltage E for the terminals 20, 22 begins to be applied between the collector-emitter of the phototransistor $Q_2$, the phototransistor $Q_2$ is turned on whereby the collector voltage of the phototransistor is not raised. When the carriers in the base of the phototransistor $Q_2$ are completely lost to recover the OFF state of the phototransistor $Q_2$, the collector voltage of the phototransistor $Q_2$ is raised.

It is to be a long turn-off time $t_2$ to reach the collector voltage of the phototransistor $Q_2$ to the forward voltage $V_{BEQ_1}$ for the base-emitter junction of the phototransistor $Q_1$ by turning the phototransistor $Q_2$ from the ON state to the OFF state. Accordingly, the transistor $Q_1$ is in the ON state during the turn-off time, the base current is turned off because of the blocking of the base current disadvantageously.

The voltage waveform between the collector-emitter of the phototransistor $Q_2$ during the above-mentioned stages is shown in FIG. 4b.

On the other hand, when the surge voltage $V_p$ having opposite polarity is applied, that is to apply the surge voltage $V_p$ in the polarities of positive at the terminal 18 and negative at the terminal 22, the surge voltage $V_p$ is applied under division through the stray capacitance $C_1$ to the phototransistor $Q_2$ at positive polarity in the collector side. In this case, the phototransistor $Q_2$ is short-circuited at the base-emitter junction of the transistor $Q_1$ whereby the breakdown of the phototransistor $Q_2$ is not caused.

As stated above, in the coupling circuit for coupling the input signal source which is electrically separated (first circuit) through the photocoupler to the other circuit (second circuit), it is serious disadvantage to erroneously operate by the surge voltage applied between the first and second circuits.

The present invention is to provide the improved coupling circuit which has not the above-mentioned disadvantages.

Figure 2:
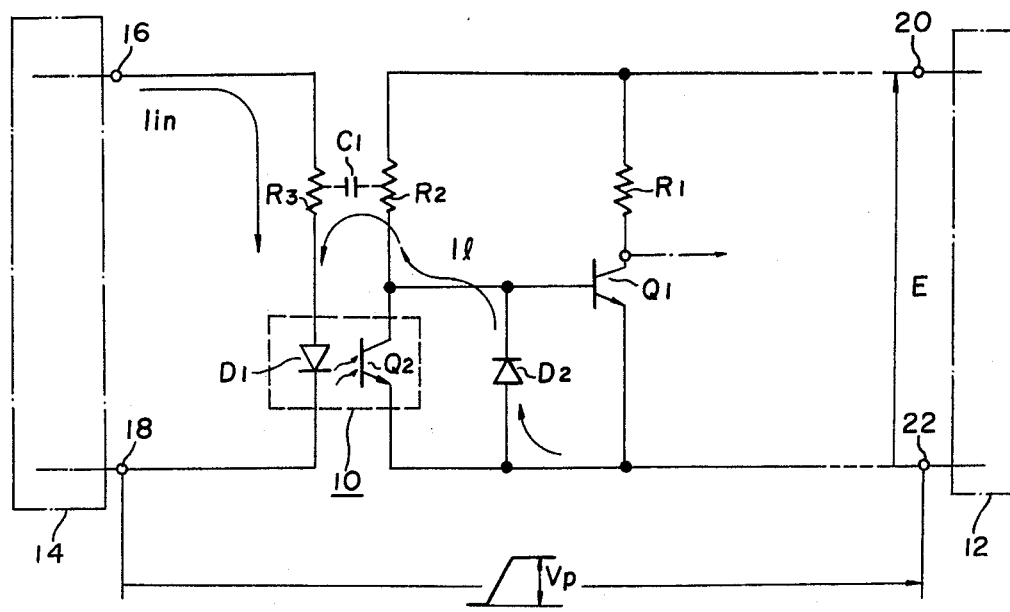
FIG. 2 is a connection diagram of one embodiment of the present invention.

FIG. 2 is a connection diagram of one embodiment of the coupling circuit of the present invention.

In FIG. 2, the reference numeral 10 designates a photocoupler comprising the light emission diode $D_1$ and the phototransistor $Q_2$. The anode of the light emission diode $D_1$ is connected through the resistor $R_3$ to the terminal 16 and the cathode of the light emission diode $D_1$ is connected to the terminal 18. The driving control circuit 14 for controlling the light emission of the light emission diode $D_1$ is connected between the terminals 16, 18. The collector of the phototransistor $Q_2$ is connected through the resistor $R_2$ to the terminal 20, and the emitter is connected to the terminal 22. The diode $D_2$ is connected in parallel between the collector-emitter of the phototransistor $Q_2$ in the reverse direction. The base and the emitter of the transistor $Q_1$ are respectively connected. The collector of the transistor $Q_1$ is connected through the resistor $R_1$ to the terminal 20. The driving circuit 12 for applying the voltage E between the terminals 20, 22 and driving the load (not shown) by the collector output voltage of the transistor $Q_1$, is connected between the terminals 20, 22.

In the structure, when the input signal current $I_{in}$ is fed from the driving control circuit 14 through the resistor $R_3$ to the light emission diode $D_1$, the light emission diode $D_1$ emits the light whereby the phototransistor $Q_2$ in the OFF state is turned on by receiving the light of the light emission diode $D_1$. During the time, the base current is fed through the resistor $R_2$ whereby the transistor $Q_1$ in the ON state is turned off by forming the short-circuit between the base-emitter by turning on the phototransistor $Q_2$. The collector voltage of the transistor $Q_1$ is raised and the output voltage is applied to the driving circuit 12 to actuate the driving circuit 12 to drive the load. At the time, the voltage applied to the diode $D_2$ is less than the reverse blocking voltage of the diode; whereby the normal operation of the diode is given without the reverse breakdown in the circuit of FIG. 2.

On the other hand, when the surge voltage $V_p$ is applied between the terminals 22, 18, the closed circuit is formed through the stray capacitance $C_1$ as the conventional circuit of FIG. 1, whereby the surge voltage $V_p$ applied between the terminals 22, 18 is applied through the stray capacitance $C_1$ between the collector-emitter of the phototransistor $Q_2$.

In the conventional circuit of FIG. 1, the reverse breakdown of the junction between the emitter-base of the phototransistor $Q_2$ is caused by the voltage. In the circuit of FIG. 2, the diode $D_2$ is connected whereby the leak current $I_l$ passed through the stray capacitance $C_1$ is by-passed to only the diode $D_2$ to fix the voltage between the collector-emitter of the phototransistor $Q_2$ by the forward voltage $V_{FD_2}$ of the diode $D_2$ whereby the reverse breakdown of the emitter-base junction of the phototransistor $Q_2$ is prevented. When the surge voltage $V_p$ applied between the terminals 22, 18 is raised to prevent the leak current $I_l$ after this time, the diode $D_2$ has the accumulated carriers to prevent the immediate recovery of the reverse blocking function of the diode $D_2$ and the transistor $Q_1$ tends to turn to the OFF state. However, the transistor $Q_1$ is not turned to the OFF state because the reverse recovering time of the diode $D_2$ is short as about 0.5 μs which is enough shorter than the switching speed of the transistor $Q_1$.

The voltage waveform at the both ends of the diode $D_2$ is shown in FIG. 4c. As it is clear from the waveform of FIG. 4c, even though the diode $D_2$ is connected, the base current of the transistor $Q_1$ is blocked during the time $t_1 + t_3$ of the sum of the rise time $t_1$ of the surge voltage $V_p$ and the reverse recovering time $t_3$ of the diode $D_2$ (the diode $D_2$ is turned to the OFF state to reach the terminal voltage of the diode $D_2$ to the forward voltage $V_{BEQ_1}$ of the base-emitter junction of the transistor $Q_1$). As stated above, the time $t_3$ is about 0.5 μs which fur shorter than the turn-off time of the transistor $Q_1$ (100 μs). Accordingly, the transistor $Q_1$ is not turned to the OFF state whereby the normal operation is maintained.

As stated above, the erroneous operation of the conventional circuit can be completely prevented as shown in FIG. 1 by connecting the diode $D_2$ in parallel between the collector-emitter of the phototransistor $Q_2$ in the reverse direction.

The erroneous operation preventing function of the excellent circuit can be attained with one diode.

Figure 3:
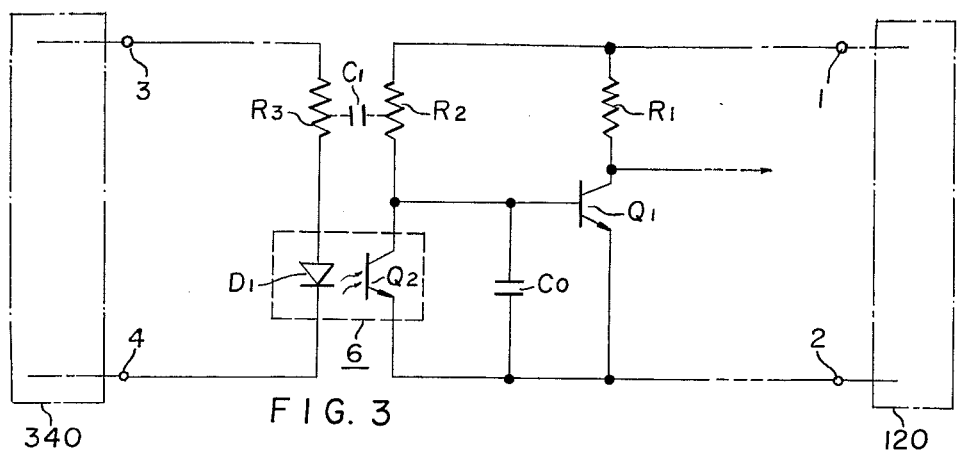
FIG. 3 is a connection diagram of the another embodiment of the present invention.

FIG. 3 is a connection diagram of the another embodiment of the coupling circuit of the invention. In the embodiment, the diode $D_2$ in FIG. 2 is substituted for with a capacitor $C_o$. The capacitor $C_o$ is selected to have a large capacitance such as 1000 PF which is quite larger than the stray capacitance $C_1$.

In the structure, the leak current $I_l$ is passed through only the capacitor $C_o$ to fix the voltage between the collector-emitter of the phototransistor $Q_2$ to less than the reverse breakdown voltage of the phototransistor $Q_2$. Accordingly, the reverse breakdown of the phototransistor $Q_2$ is blocked to prevent the erroneous operation.

In the above-mentioned embodiments, the diode or the capacitor is used as the element connected in parallel to the phototransistor $Q_2$. The same effect can be attained by using a Zener diode.

It is also possible to attain the same effect without using the diode, the capacitor or the Zener diode by using the transistor $Q_1$ which has a low reverse breakdown voltage of the base-emitter junction (as the next one of the phototransistor $Q_2$) whereby the reverse breakdown of the junction of the transistor $Q_1$ is resulted prior to the reverse breakdown of the junction of the phototransistor $Q_2$.

In the embodiments, the photocoupler of the phototransistor is used as a light-receiving element. Thus, the same effect can be attained when a photocoupler of a photothyristor is used as the light-receiving element.

As stated above, in the coupling circuit of the present invention, the means for blocking the reverse breakdown of the light-receiving element of the photocoupler is connected in parallel to the light-receiving element thereby attaining the coupling circuit which does not cause the erroneous operation by applying high surge voltage between the input-output.

What is claimed is:

1. A coupling circuit for connecting a first circuit and a second circuit comprising:

a photocoupler including a light emission element whose light emission is controlled by the first circuit and a light receiving element for driving the second circuit by receiving the light from the light emission element to be turned on;

the light emission element and the light receiving element being electrically connected through a stray capacitance arising between the first circuit and the second circuit so that a reverse breakdown of the light receiving element can be produced by a surge voltage applied through the stray capacitance to the light receiving element; and means connected in parallel to the light receiving element for blocking the reverse breakdown of the light receiving element.

2. A coupling circuit according to claim 1, wherein said means for blocking the reverse breakdown of the light-receiving element is means for maintaining the voltage between the terminals of said light-receiving element lower than the reverse breakdown voltage of said light-receiving element.

3. A coupling circuit according to claim 2, wherein said means for maintaining the voltage is a diode.

4. A coupling circuit according to claim 2, wherein said means for maintaining the voltage is a capacitor.

5. A coupling circuit according to claim 2, wherein said means for maintaining the voltage is a Zener diode.

6. A coupling circuit according to claim 1, wherein said means for blocking the reverse breakdown of said light-receiving element is a switching element which has a reverse breakdown prior to the reverse breakdown of said light-receiving element.

7. A coupling circuit according to claim 6, wherein said switching element is a transistor.

8. A coupling circuit according to claim 1, wherein said light emission element is a light emission diode and said light-receiving element is a phototransistor.

9. A coupling circuit according to claim 1, wherein said light emission element is a light emission diode and said light-receiving element is a photothyristor.

* * * * *